United States Patent
Asadizanjani et al.

(10) Patent No.: US 11,270,439 B2
(45) Date of Patent: Mar. 8, 2022

(54) HISTOGRAM-BASED METHOD FOR AUTO SEGMENTATION OF INTEGRATED CIRCUIT STRUCTURES FROM SEM IMAGES

(71) Applicant: UNIVERSITY OF FLORIDA RESEARCH FOUNDATION, INCORPORATED, Gainesville, FL (US)

(72) Inventors: Navid Asadizanjani, Gainesville, FL (US); Damon Woodard, Gainesville, FL (US); Domenic J. Forte, Gainesville, FL (US); Ronald Wilson, Gainesville, FL (US)

(73) Assignee: University of Florida Research Foundation, Incorporated, Gainesville, FL (US)

( * ) Notice: Subject to any disclaimer, the term of this patent is extended or adjusted under 35 U.S.C. 154(b) by 0 days.

(21) Appl. No.: 17/250,947

(22) PCT Filed: Oct. 9, 2019

(86) PCT No.: PCT/US2019/055418
§ 371 (c)(1),
(2) Date: Apr. 1, 2021

(87) PCT Pub. No.: WO2020/096724
PCT Pub. Date: May 14, 2020

(65) Prior Publication Data
US 2021/0312630 A1 Oct. 7, 2021

Related U.S. Application Data

(60) Provisional application No. 62/758,379, filed on Nov. 9, 2018.

(51) Int. Cl.
*G06F 30/39* (2020.01)
*G06T 7/11* (2017.01)

(52) U.S. Cl.
CPC ............... *G06T 7/11* (2017.01); *G06F 30/39* (2020.01); *G06T 2207/10061* (2013.01); *G06T 2207/20032* (2013.01); *G06T 2207/30148* (2013.01)

(58) Field of Classification Search
CPC . G06F 30/39; G06T 7/11; G06T 2207/10061; G06T 2207/20032; G06T 2207/30148
See application file for complete search history.

(56) References Cited

U.S. PATENT DOCUMENTS

| 5,694,481 A | 12/1997 | Lam et al. |
| 6,353,688 B1 * | 3/2002 | Puetter ............... G06T 9/00 |
| | | 382/205 |

(Continued)

OTHER PUBLICATIONS

Teutsch et al. ("Adaptive real-time image smoothing using local binary patterns and Gaussian filters," IEEE International Conference on Image Processing, Date of Conference: Sep. 15-18, 2013) (Year: 2013).*

(Continued)

*Primary Examiner* — Yubin Hung
(74) *Attorney, Agent, or Firm* — Alston & Bird LLP

(57) ABSTRACT

A histogram-based method for auto segmentation of integrated circuit structures is disclosed. The method includes an auto-segmentation process/algorithm, which works on the histogram of the SEM image and does not try to model the noise sources or the features. The auto-segmentation process/algorithm extracts the number of peaks in the histogram from low magnification SEM images or SEM images not necessarily having high quality images, significantly simplifies the traditionally lengthy and expensive IC reverse engineering efforts. Hence, the size of the image does not (Continued)

affect the final segmentation. The auto-segmentation process/algorithm performs the steps of: extract a first histogram from the first SEM image; identifying boundaries of the plurality of structural elements in the IC based at least in part on an output of the first histogram; and auto-segmenting the first SEM image into the plurality of structural elements.

20 Claims, 11 Drawing Sheets

(56) References Cited

U.S. PATENT DOCUMENTS

| | | | | |
|---|---|---|---|---|
| 2005/0027482 | A1* | 2/2005 | Benaoudia | G01N 21/3554 |
| | | | | 702/183 |
| 2006/0221322 | A1* | 10/2006 | Tinnemans | G03F 7/70291 |
| | | | | 355/69 |
| 2015/0139531 | A1 | 5/2015 | Hirai et al. | |
| 2015/0221076 | A1 | 8/2015 | Gao et al. | |
| 2018/0025246 | A1 | 1/2018 | Barton | |

OTHER PUBLICATIONS

Zhang et al. ("Parametric model for image blur kernel estimation," International Conference on Orange Technologies, Date of Conference: Oct. 23-26, 2018) (Year: 2018).*

Ebeling et al. ("ASMOOTH: A simple and efficient algorithm for adaptive kernel smoothing of two-dimensional imaging data," arXiv: astro-ph/0601306, Jan. 14, 2016) (Year: 2016).*

International Searching Authority, International Search Report and Written Opinion for International Application No. PCT/US2019/055418, dated Oct. 9, 2019, (14 pages), United States Patent and Trademark Office, USA.

\* cited by examiner

HISTOGRAM-BASED METHOD FOR AUTO SEGMENTATION OF INTEGRATED CIRCUIT STRUCTURES FROM SEM IMAGES

CROSS REFERENCE TO RELATED APPLICATIONS

This application is a National Stage Application filed under 35 U.S.C. § 371, of International Application No. PCT/US2019/055418 filed Oct. 9, 2019, which claims priority to U.S. Provisional Patent Application Ser. No. 62/758,379 filed on Nov. 9, 2018; the contents of both of which are hereby incorporated by reference in their entireties.

TECHNICAL FIELD

The present application relates to integrated circuit structure analysis, and in particular, to a segmentation technique based at least in part on scanning electron microscope (SEM) images.

BACKGROUND

Reverse engineering is the science of understanding the constituent components from a final product. It is essentially the engineering work flow performed in reverse. This engineering technique has been applied to a variety of products ranging all the way from aircraft to integrated circuits. As intuition suggests, the higher the complexity in the product, the higher the hardships involved in reverse engineering the product. This is especially true with the present-day Integrated Circuits (IC) with several billion transistors and interconnections occupying a very small area on a silicon wafer. Despite the obvious shortcoming of illegal duplication of proprietary technology, reverse engineering has several benefits. One of them is to have a better understanding of the structure of the final product and the effect of the physical processes used in developing the manufacturing of the product. For instance, reverse engineering methods can be used to analyze and debug an integrated circuit. Similar applications can be seen in Trojan detection. In addition, reverse engineering has been applied in settling legal disputes between companies on infringement of intellectual property usage.

Currently, reverse engineering of IC has been mostly done with the help of subject matter experts. Detailed optical images of the IC die are taken and components are marked down by hand. This is a very laborious process. There is a need to have a faster and more cost-effective reverse engineering methodology for IC chips.

SUMMARY

A method of segmenting a Scanning Electron Microscopy (SEM) image of an integrated circuit (IC) is disclosed, including: providing a first SEM image of the IC, which is acquired under a first set of SEM parameters, selecting a kernel size defined by a smallest feature extracted in the first SEM image. Then an auto-segmentation process/algorithm incorporating the kernel size is applied to the first SEM image. The auto-segmentation process/algorithm performs a set of instructions: it extracts a first histogram from the first SEM image, wherein the first histogram outputs a median size and occurring frequencies of features at least equal or larger than the kernel size. It then determines, decides, locates, identifies, and/or similar words used herein interchangeably boundaries of the plurality of structural elements in the IC based at least in part on an output of the first histogram; and auto-segments the first SEM image into the plurality of structural elements.

Typically, the first SEM image is a raw SEM image directly from SEM and the first set of SEM parameters has a first magnification, a first resolution, and a first dwelling time.

The auto-segmentation process/algorithm performs tasks of filtering the image with a filter of the kernel size, convolving the filter with the SEM image in a row raster fashion using a stride equal to the median size of the first histogram to get occurring frequencies of the kernel over all rows, extracting a second histogram from the first histogram of the SEM image, combining the first and the second histograms. setting up a threshold to filter the combined histogram, optimizing the combined histogram, finding local peaks in the combined histogram, wherein the local peaks define a plurality of clusters, identifying boundaries of the plurality of clusters by finding minimum frequency spaces between two of the plurality of clusters; and segmenting the IC along the boundaries of the plurality of clusters to form the plurality of structural elements.

It is also feasible that segmented IC contain smaller elements for reverse engineering.

Optionally the structural elements of the IC include doped regions, metal layers, and polysilicon regions.

Sometimes the largest kernel size is used to speed up the segmentation.

Optionally, the auto-segmentation process/algorithm can be made completely automated with no human interaction and supervision.

BRIEF DESCRIPTION OF DRAWINGS

FIG. 2(a) shows the image focused on 20 μm features. FIG. 2(b) shows an image focused on 500 μm features.

FIG. 3(a) shows an image with resolution of 512×512 pixels. FIG. 3(b) shows an image with resolution of 2048×2048 pixels.

FIG. 4(a) shows an image with dwelling time of 3.2 μs/pixel. FIG. 4(b) shows an image with dwelling time of 32 μs/pixel.

FIG. 6(a) shows the raw image histogram and FIG. 6(b) shows the extracted image histogram.

FIG. 7(a) shows the raw accumulator for histogram frequency and FIG. 7(b) shows the normalized accumulator multiplied by frequency.

Figure 1:
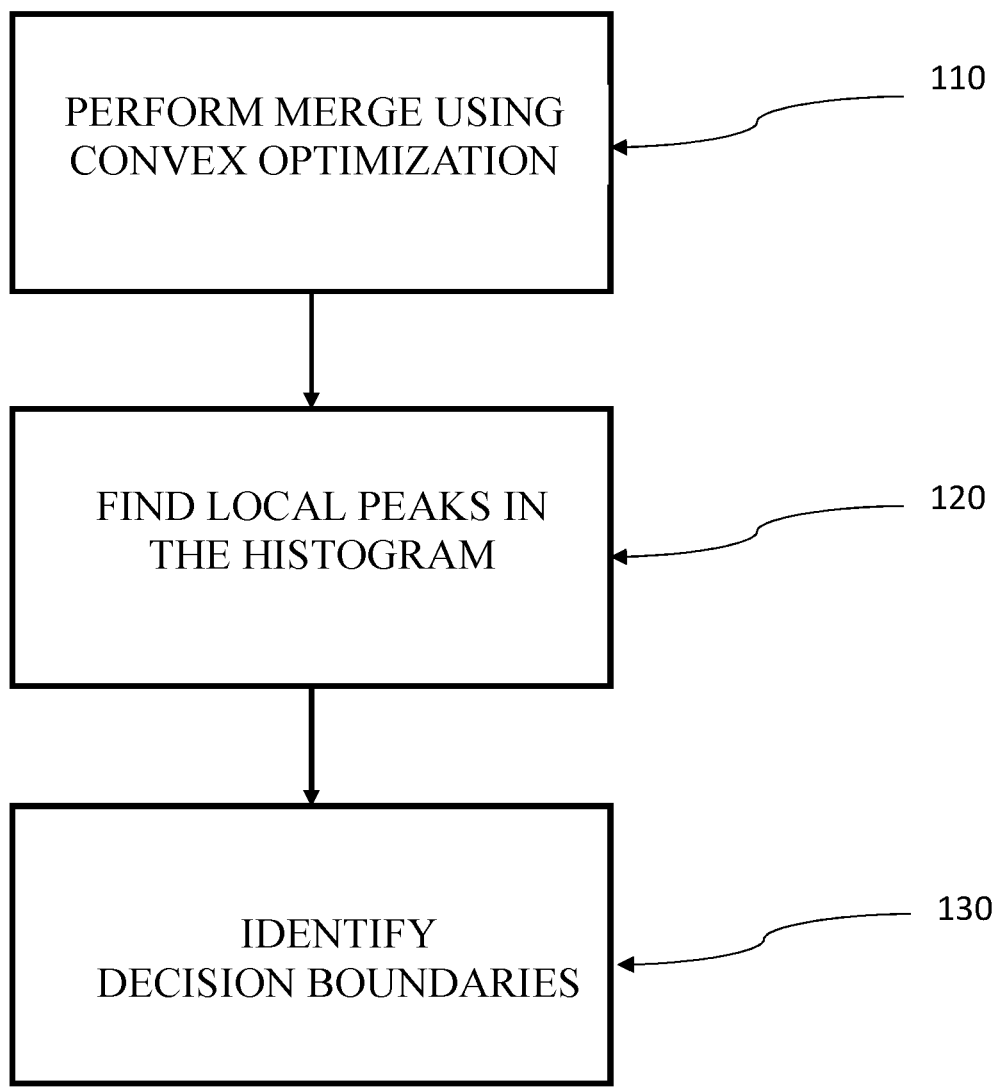
FIG. 1 shows a schematic flowchart for the image segmentation process according to one embodiment of the present invention.

COMPUTER PROGRAM PRODUCTS, METHODS, AND COMPUTING Entities

Embodiments of the present invention may be implemented in various ways, including as computer program products that comprise articles of manufacture. Such computer program products may include one or more software components including, for example, software objects, methods, data structures, or the like. A software component may be coded in any of a variety of programming languages. An illustrative programming language may be a lower-level programming language such as an assembly language associated with a particular hardware architecture and/or operating system platform. A software component comprising assembly language instructions may require conversion into executable machine code by an assembler prior to execution by the hardware architecture and/or platform. Another example programming language may be a higher-level programming language that may be portable across multiple architectures. A software component comprising higher-level programming language instructions may require conversion to an intermediate representation by an interpreter or a compiler prior to execution.

Other examples of programming languages include, but are not limited to, a macro language, a shell or command language, a job control language, a script language, a database query or search language, and/or a report writing language. In one or more example embodiments, a software component comprising instructions in one of the foregoing examples of programming languages may be executed directly by an operating system or other software component without having to be first transformed into another form. A software component may be stored as a file or other data storage construct. Software components of a similar type or functionally related may be stored together such as, for example, in a particular directory, folder, or library. Software components may be static (e.g., pre-established or fixed) or dynamic (e.g., created or modified at the time of execution).

A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, computer program products, program code, and/or similar terms used herein interchangeably). Such non-transitory computer-readable storage media include all computer-readable media (including volatile and non-volatile media).

In one embodiment, a non-volatile computer-readable storage medium may include a floppy disk, flexible disk, hard disk, solid-state storage (SSS) (e.g., a solid state drive (SSD), solid state card (SSC), solid state module (SSM), enterprise flash drive, magnetic tape, or any other non-transitory magnetic medium, and/or the like. A non-volatile computer-readable storage medium may also include a punch card, paper tape, optical mark sheet (or any other physical medium with patterns of holes or other optically recognizable indicia), compact disc read only memory (CD-ROM), compact disc-rewritable (CD-RW), digital versatile disc (DVD), Blu-ray disc (BD), any other non-transitory optical medium, and/or the like. Such a non-volatile computer-readable storage medium may also include read-only memory (ROM), programmable read-only memory (PROM), erasable programmable read-only memory (EPROM), electrically erasable programmable read-only memory (EEPROM), flash memory (e.g., Serial, NAND, NOR, and/or the like), multimedia memory cards (MMC), secure digital (SD) memory cards, SmartMedia cards, CompactFlash (CF) cards, Memory Sticks, and/or the like. Further, a non-volatile computer-readable storage medium may also include conductive-bridging random access memory (CBRAM), phase-change random access memory (PRAM), ferroelectric random-access memory (FeRAM), non-volatile random-access memory (NVRAM), magnetoresistive random-access memory (MRAM), resistive random-access memory (RRAM), Silicon-Oxide-Nitride-Oxide-Silicon memory (SONOS), floating junction gate random access memory (FJG RAM), Millipede memory, racetrack memory, and/or the like.

In one embodiment, a volatile computer-readable storage medium may include random access memory (RAM), dynamic random access memory (DRAM), static random access memory (SRAM), fast page mode dynamic random access memory (FPM DRAM), extended data-out dynamic random access memory (EDO DRAM), synchronous dynamic random access memory (SDRAM), double data rate synchronous dynamic random access memory (DDR SDRAM), double data rate type two synchronous dynamic random access memory (DDR2 SDRAM), double data rate type three synchronous dynamic random access memory (DDR3 SDRAM), Rambus dynamic random access memory (RDRAM), Twin Transistor RAM (TTRAM), Thyristor RAM (T-RAM), Zero-capacitor (Z-RAM), Rambus in-line memory module (RIMM), dual in-line memory module (DIMM), single in-line memory module (SIMM), video random access memory (VRAM), cache memory (including various levels), flash memory, register memory, and/or the like. It will be appreciated that where embodiments are described to use a computer-readable storage medium, other types of computer-readable storage media may be substituted for or used in addition to the computer-readable storage media described above.

As should be appreciated, various embodiments of the present invention may also be implemented as methods, apparatus, systems, computing devices, computing entities, and/or the like. As such, embodiments of the present invention may take the form of an apparatus, system, computing device, computing entity, and/or the like executing instructions stored on a computer-readable storage medium to perform certain steps or operations. Thus, embodiments of the present invention may also take the form of an entirely hardware embodiment, an entirely computer program product embodiment, and/or an embodiment that comprises combination of computer program products and hardware performing certain steps or operations.

Embodiments of the present invention are described below with reference to block diagrams and flowchart illustrations. Thus, it should be understood that each block of the block diagrams and flowchart illustrations may be implemented in the form of a computer program product, an entirely hardware embodiment, a combination of hardware and computer program products, and/or apparatus, systems, computing devices, computing entities, and/or the like carrying out instructions, operations, steps, and similar words used interchangeably (e.g., the executable instructions, instructions for execution, program code, and/or the like) on a computer-readable storage medium for execution. For example, retrieval, loading, and execution of code may be performed sequentially such that one instruction is retrieved, loaded, and executed at a time. In some exemplary embodiments, retrieval, loading, and/or execution may be performed in parallel such that multiple instructions are retrieved, loaded, and/or executed together. Thus, such embodiments can produce specifically-configured machines performing the steps or operations specified in the block diagrams and flowchart illustrations. Accordingly, the block diagrams and flowchart illustrations support various combinations of embodiments for performing the specified instructions, operations, or steps. The instructions, operations, and/or steps can be carried out by apparatus, systems, computing devices, computing entities, and/or the like.

Such apparatus, systems, computing devices, computing entities, and/or the like can be adapted to perform the functions, operations, and/or processes described herein. Such functions, operations, and/or processes may include, for example, transmitting, receiving, operating on, processing, displaying, storing, determining, creating/generating, monitoring, evaluating, comparing, and/or similar terms used herein interchangeably. In one embodiment, these functions, operations, and/or processes can be performed on data, content, information, and/or similar terms used herein interchangeably.

As indicated, in one embodiment, the apparatus, systems, computing devices, computing entities, and/or the like may also include one or more communications interfaces for communicating with various computing entities, such as by communicating data, content, information, and/or similar terms used herein interchangeably that can be transmitted, received, operated on, processed, displayed, stored, and/or the like.

In one embodiment, the apparatus, systems, computing devices, computing entities, and/or the like may include or be in communication with one or more processing elements (also referred to as processors, processing circuitry, processing device, and/or similar terms used herein interchangeably) that communicate with other elements within the apparatus, systems, computing devices, computing entities, and/or the like via a bus, for example. As will be understood, the processing element may be embodied in a number of different ways. For example, the processing element may be embodied as one or more complex programmable logic devices (CPLDs), "cloud" processors, microprocessors, multi-core processors, coprocessing entities, application-specific instruction-set processors (ASIPs), microcontrollers, and/or controllers. Further, the processing element may be embodied as one or more other processing devices or circuitry. The term circuitry may refer to an entirely hardware embodiment or a combination of hardware and computer program products. Thus, the processing element may be embodied as integrated circuits, application specific integrated circuits (ASICs), field programmable gate arrays (FPGAs), programmable logic arrays (PLAs), hardware accelerators, other circuitry, and/or the like. As will therefore be understood, the processing element may be configured for a particular use or configured to execute instructions stored in volatile or non-volatile media or otherwise accessible to the processing element. As such, whether configured by hardware or computer program products, or by a combination thereof, the processing element may be capable of performing steps or operations according to embodiments of the present invention when configured accordingly.

In one embodiment, the apparatus, systems, computing devices, computing entities, and/or the like may further include or be in communication with non-volatile media (also referred to as non-volatile storage, memory, memory storage, memory circuitry and/or similar terms used herein interchangeably). In one embodiment, the non-volatile storage or memory may include one or more non-volatile storage or memory media, including but not limited to hard disks, ROM, PROM, EPROM, EEPROM, flash memory, MMCs, SD memory cards, Memory Sticks, CBRAM, PRAM, FeRAM, NVRAM, MRAM, RRAM, SONOS, FJG RAM, Millipede memory, racetrack memory, and/or the like. As will be recognized, the non-volatile storage or memory media may store databases, database instances, database management systems, data, applications, programs, program modules, scripts, source code, object code, byte code, compiled code, interpreted code, machine code, executable instructions, and/or the like. The term database, database instance, database management system, and/or similar terms used herein interchangeably may refer to a collection of records or data that is stored in a computer-readable storage medium using one or more database models, such as a hierarchical database model, network model, relational model, entity-relationship model, object model, document model, semantic model, graph model, and/or the like.

In one embodiment, the apparatus, systems, computing devices, computing entities, and/or the like may further include or be in communication with volatile media (also referred to as volatile storage, memory, memory storage, memory circuitry and/or similar terms used herein interchangeably). In one embodiment, the volatile storage or memory may also include one or more volatile storage or memory media, including but not limited to RAM, DRAM, SRAM, FPM DRAM, EDO DRAM, SDRAM, DDR SDRAM, DDR2 SDRAM, DDR3 SDRAM, RDRAM, TTRAM, T-RAM, Z-RAM, RIMM, DIMM, SIMM, VRAM, cache memory, register memory, and/or the like. As will be recognized, the volatile storage or memory media may be used to store at least portions of the databases, database instances, database management systems, data, applications, programs, program modules, scripts, source code, object code, byte code, compiled code, interpreted code, machine code, executable instructions, and/or the like being executed by, for example, the processing element. Thus, the databases, database instances, database management systems, data, applications, programs, program modules, scripts, source code, object code, byte code, compiled code, interpreted code, machine code, executable instructions, and/or the like may be used to control certain aspects of the operation of the apparatus, systems, computing devices, computing entities, and/or the like with the assistance of the processing element and operating system.

As indicated, in one embodiment, the apparatus, systems, computing devices, computing entities, and/or the like may also include one or more communications interfaces for communicating with various computing entities, such as by communicating data, content, information, and/or similar terms used herein interchangeably that can be transmitted, received, operated on, processed, displayed, stored, and/or the like. Such communication may be executed using a wired data transmission protocol, such as fiber distributed data interface (FDDI), digital subscriber line (DSL), Ethernet, asynchronous transfer mode (ATM), frame relay, data over cable service interface specification (DOCSIS), or any other wired transmission protocol. Similarly, the apparatus, systems, computing devices, computing entities, and/or the like may be configured to communicate via wireless external communication networks using any of a variety of protocols, such as general packet radio service (GPRS), Universal Mobile Telecommunications System (UMTS), Code Division Multiple Access 2000 (CDMA2000), CDMA20001× (1×RTT), Wideband Code Division Multiple Access (WCDMA), Global System for Mobile Communications (GSM), Enhanced Data rates for GSM Evolution (EDGE), Time Division-Synchronous Code Division Multiple Access (TD-SCDMA), Long Term Evolution (LTE), Evolved Universal Terrestrial Radio Access Network (E-UTRAN), Evolution-Data Optimized (EVDO), High Speed Packet Access (HSPA), High-Speed Downlink Packet Access (HSDPA), IEEE 802.11 (Wi-Fi), Wi-Fi Direct, 802.16 (WiMAX), ultra-wideband (UWB), infrared (IR) protocols, near field communication (NFC) protocols, Wibree, Bluetooth protocols, wireless universal serial bus (USB) protocols, and/or any other wireless protocol.

Although not shown, the apparatus, systems, computing devices, computing entities, and/or the like may include or be in communication with one or more input elements, such as a keyboard input, a mouse input, a touch screen/display input, motion input, movement input, audio input, pointing device input, joystick input, keypad input, and/or the like. The apparatus, systems, computing devices, computing entities, and/or the like may also include or be in communication with one or more output elements (not shown), such as audio output, video output, screen/display output, motion output, movement output, and/or the like.

As will be appreciated, one or more of the management computing entity's 100 components may be located remotely from other apparatus, systems, computing devices, computing entities, and/or the like components, such as in a distributed system. Furthermore, one or more of the components may be combined and additional components performing functions described herein may be included in the apparatus, systems, computing devices, computing entities, and/or the like. Thus, the apparatus, systems, computing devices, computing entities, and/or the like can be adapted to accommodate a variety of needs and circumstances. As will be recognized, these architectures and descriptions are provided for exemplary purposes only and are not limiting to the various embodiments.

DETAILED DESCRIPTION

The following detailed description, figures, and appended claims signify the nature and advantages of the innovations, embodiments, and/or examples of the claimed inventions. All of the figures signify innovations, embodiments, and/or examples of the claimed inventions for purposes of illustration only and do not limit the scope of the claimed inventions. Such figures are not necessarily drawn to scale, and are part of embodiments of the present invention.

In the figures, similar components or features may have the same, or similar, reference signs in the form of labels (such as alphanumeric symbols, e.g., reference numerals), and may signify similar or equivalent functionality. Further, various components of the same type may be distinguished by following the reference label by a dash and a second label that distinguishes among the similar components. If only the first reference label is used in the specification, the description is applicable to any one of the similar components having the same first reference label irrespective of the second reference label. The Figures and the following Detailed Description signify innovations, embodiments and/or examples by way of illustration only, with various features, structures or characteristics described together in a single embodiment to streamline the present application. Variations of any of the elements, processes, machines, systems, manufactures or compositions disclosed by such exemplary innovations, embodiments and/or examples will be readily recognized and may be used in commerce without departing from the principles of what is claimed. The figures and detailed description may also signify, implicitly or explicitly, advantages and improvements of a subset of the exemplary embodiments described herein.

In the figures and detailed description, numerous specific details may be described to provide a thorough understanding of one or more of the exemplary innovations, embodiments and/or examples. In the interest of not obscuring the presentation of the exemplary innovations, embodiments and/or examples in the following detailed description, some processing steps or operations that are known in the art may have been combined together for presentation and for illustration purposes and might not be described in detail. However, a person skilled in the art will recognize that these exemplary innovations, embodiments and/or examples may be used in commerce without these specific details or with equivalents thereof. In other instances, well-known processes and devices are not described in detail as not to unnecessarily obscure aspects of these exemplary innovations, embodiments and/or examples. In other instances, some processing steps or operations that are known in the art may not be described at all. The following description is instead focused on the distinctive features or elements of various exemplary innovations, embodiments and/or examples. Furthermore, while this description may refer to some components of the structure in the singular tense, more than one component may be depicted throughout the Figures and like components are labeled with like numerals.

Incorporation of computer vision algorithms into reverse engineering enables semi-automation which can make the entire process more efficient, faster and cost less. However, a simple method such as processing the image using a median filter followed by correlation matching does not help with reverse engineering advanced IC chips produced in higher node technologies, where optical imaging alone has become obsolete. Current and future advanced notes require imaging modalities with higher resolution such as SEM, Transmission Electron Microscopy (TEM), and Confocal Electron Microscopy (CEM).

Figure 2A:
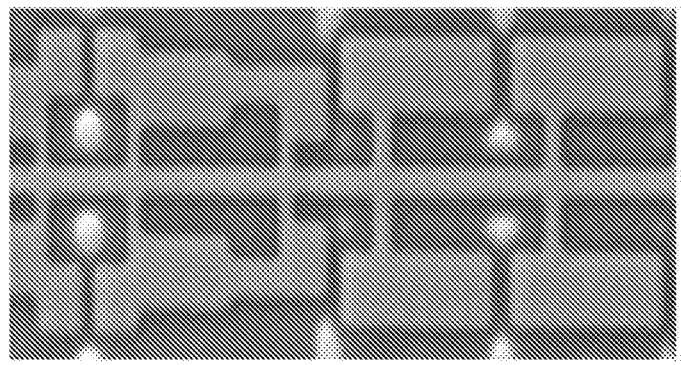
FIGS. 2(a) and 2(b) illustrate SEM images of an exemplary IC circuit under different magnifications.
Figure 2B:
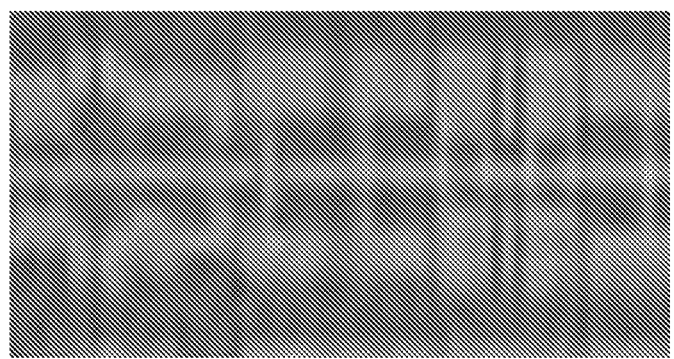

The disclosed methodology in this application focuses on SEM. SEM images are produced by accelerating electrons toward a region of interest and obtaining the scattered electrons from their interactions with the target materials. There are two main types of interactions: Secondary Electrons (SE) and Back Scattered Electrons (BSE). The imaging quality from these two interactions depend on the constituent materials in the IC chip being imaged and a number of critical parameters set by the SEM operator such as:

excitation voltage of the electrons: it controls the depth of electron penetration into the sample. The higher the voltage is, the deeper the penetration can be.

magnification: it helps zoom into the image. Smaller features can be better imaged with proper magnification, as shown in FIGS. 2(*a*) and 2(*b*). FIG. 2(*a*) shows a SEM image using magnification focused on 20 µm features. FIG. 2(*b*) shows a SEM image using magnification focused on 500 µm features. The same area of the circuit shows clearer features with the higher magnification.

Figure 3A:
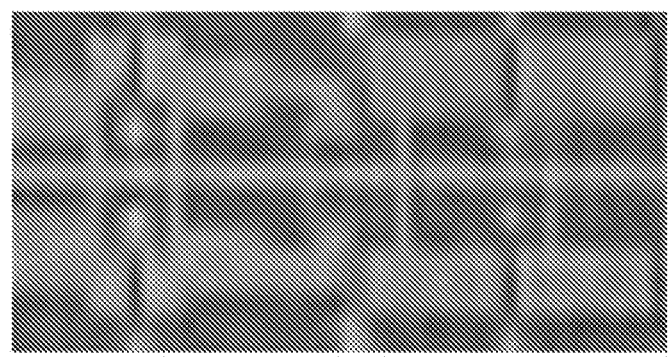
FIGS. 3(a) and 3(b) illustrate SEM images of an exemplary IC circuit under different image resolutions.
Figure 3B:
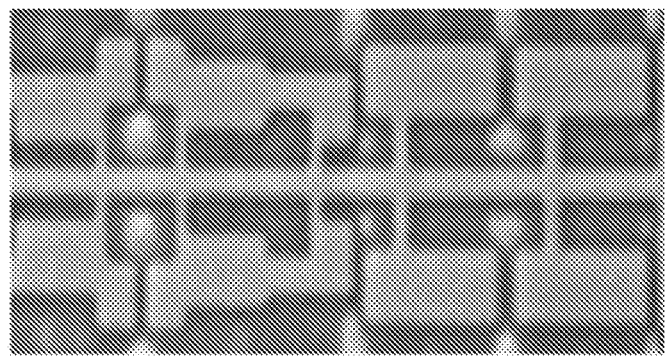

Resolution: This parameter refers to the number of pixels in the image. The higher the pixel count is, the better off the quality of the image is. This can be seen in FIGS. 3(a) and 3(b) which illustrate SEM images of an exemplary IC circuit under different image resolutions. FIG. 3(a) shows an image with resolution of 512×512 pixels and FIG. 3(b) shows an image with resolution of 2048×2048 pixels. Clearly the image in FIG. 3(b) is sharper because it has 16 times the pixels as the image in FIG. 3(a) does.

Figure 4A:
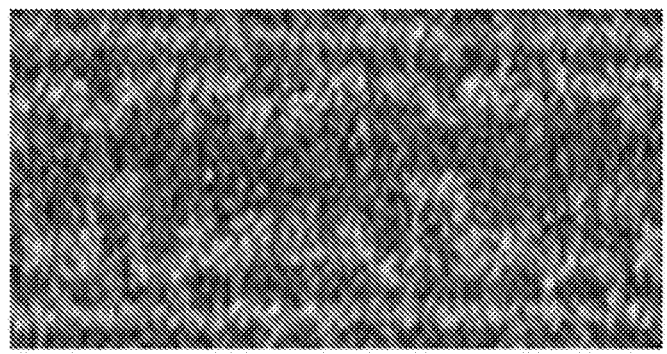
FIGS. 4(a) and 4(b) illustrate SEM images of an exemplary IC circuit under different image dwelling times.
Figure 4B:
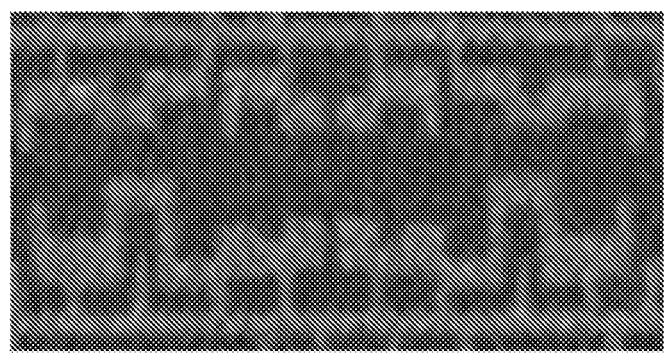

Dwelling Time: This refers to the time the scanning electron beam takes to measure a single pixel in the image. The longer the scanning time spent, the better off the quality of the image is. This can be seen in FIGS. 4(a) and 4(b) which illustrate SEM images of an exemplary IC circuit under different image dwelling times. FIG. 4(a) shows an image with a dwelling time of 3.2 μs/pixel. FIG. 4(b) shows an image with a dwelling time of 32 μs/pixel. FIG. 4(b) has sharper circuit images as there is 10 times longer measurement spent on the same area than FIG. 4(a) does.

An IC chip needs to be de-packaged and delayered before it is imaged by SEM. De-packaging involves extracting dies from die case and delayering involves removal of materials from dies at a set depth. After delayering, the IC chip is imaged at SEM in a row raster fashion. In this disclosure, for consistency, only secondary electron images are shown in the figures. However, this method can also be applied to back scattered electron images in the electron scanner.

Even though SEM can produce images of considerably high resolution, it may have inherent noise that introduces artifacts in the images. Most current noise reduction methods overcome the inherent flaws by tuning the parameters in SEM settings as discussed above. However, the process to get higher quality images with optimized settings takes a very long time. Therefore, that time may not be feasible anymore for a higher node technology (i.e. ~<50 nm). This is one of the major obstacles for reverse engineering.

To reduce the time requirements, it may be necessary to use lower quality images which includes the inherent noise. However, the noises in low quality image come from multiple factors, such as electron scattering and diffusion, atmospheric exposure, manufacturing defects, etc. But the exact degree of contribution from each one of these noise sources is hard to model accurately.

A methodology is developed to analyze a low magnification SEM image first and auto-segment the image then into structural elements for IC chip reverse engineering.

The current disclosure provides a segmentation method to improve imaging quality of integrated circuit structures using SEM images acquired under low magnification and often having poor qualities.

The method includes extracting the histogram of the SEM image with an auto-segmentation process/algorithm, which corrects the extracted data and segments the histogram based at least in part on the number of its peaks. The procedure is mapped by the integrated algorithm. All visible peaks are extracted from histogram even in the presence of noise.

The auto-segmentation process/algorithm uses one parameter: the size of the smallest feature that needs to be extracted. This can be easily calculated from either the raw image or simply set the smallest feature to the minimum size possible without affecting the result.

According to one embodiment of the disclosure, a method of segmenting IC from the SEM image includes: receiving/providing a SEM image of the IC, which is acquired at low magnification; selecting a kernel size equal to the smallest feature that needs to be extracted in the SEM image; setting up an auto-segmentation process/algorithm based at least in part on the kernel size; applying the auto-segmentation process/algorithm to find locations in the IC for auto-segmenting the IC into structural elements; and segmenting the IC based at least in part on the output of the auto-segmentation process/algorithm.

According to another embodiment of the disclosure, the auto-segmentation process/algorithm further includes: filter the image with a median filter of the kernel size; convolve the filter with the SEM image in a row raster fashion using a stride equal to the chosen size to get occurring frequencies of those kernels over all rows; extract a histogram of the SEM image; then combine and optimize the histograms; find local peaks in the histogram, wherein the local peaks define clusters; identify boundaries of the clusters by finding minimum frequency spaces between two clusters; and finally segment the IC along the boundaries of the clusters.

FIG. 1 shows a schematic flowchart for the auto-segmentation process, executed as an auto-segmentation process/algorithm. The process comprises at least three steps/operations. Step/operation 110 comprises the performance of a simple merge using convex optimization. Step/operation 120 comprises finding local peaks in the histogram. And step/operation 130 comprises making decisions on discovered boundaries of the segmentation.

In one embodiment, the auto-segmentation process/algorithm has one optional parameter, which is the size of the smallest feature that would be present in the target image. For the present application, the smallest feature size would be the cross-section of the Vertical Interconnect Access, commonly called VIA in the imaging plane. However, this parameter can be set to a default kernel size of 2×2. The idea is to use the largest kernel size possible to speed up the segmentation.

A. Simple Merge Using Convex Optimization

In performing simple merge using convex optimization (step/operation 110), the initial step is to extract the actual histogram of the image. To do that, the image is filtered. In one embodiment, a median filter is employed and convolved with the image in a row raster fashion using a stride which is equal to the width of the kernel. This ensures no overlap between two consecutive patches. The median value of the number of pixels in the kernel is calculated and the difference of occurring frequency between each consecutive patch is extracted. Once a row is complete, a frequency distribution of the differences between consecutive medians is taken. The differences are stored in "α" and their corresponding frequencies in "β." Equation (1) represents the cost function to calculate J for a row.

$$J=\min\{\beta(i)-\beta^*\alpha(i)|i=1,2\ldots n\} \quad (1)$$

In Equation (1), n is the number of differences. An optimization is performed next, using the cost function T given above and a merge threshold "τ" for the current row is calculated. The optimization produces a vector of values for each possible threshold value of which the threshold with the minimum cost function value is taken as the merge threshold. All kernel blocks with median difference less than "τ" are merge together and their combined median is extracted. All pixels in these kernels will have their intensity values replaced by the combined median. This process is performed on all rows. The idea behind this step is to filter out excessive high frequency variation without modifying the pixel values to a great degree. Once completed, the frequency distribution of pixel intensity values is extracted from the entire image. This is the actual histogram for the image.

B. Finding Local Peaks in the Histogram

At step/operation 120, the local maxima are extracted from the histogram using Algorithm 1 shown below. With several local peaks in the histogram, Algorithm 1 (below) is used to evaluate the validity of each one of the possible peaks. The algorithm votes for each peak and the votes are recorded in an accumulator array. Once the complete accumulator is obtained, the smaller peaks that exist together are merged and the highest peak between them is marked as the center. These centers define the number of cluster components present in the image. This process greatly reduces the number of incorrect segmentations in the image.

---

Algorithm 1 To find significant peaks in histogram

---

1: Soft intensity using correspoading frequency in decreasing order and save as I
2: Set I ← I − I [max(frequency)]
3: Extract positive values from I and save as F
4: Initialize currentIntensity to 1
5: Initialize an accumulator array of size(F)
6: while currentIntensity < max(F) do
7:     Find index of currentIntensity in F and save as $f$
8:     Assign all elements from F[0] to F[f] into G
9:     Initialize flag to True
10:    while flag is True do
11:       if currentIntensity + 1 in G then
12:          currentIntensity ← currentIntensity + 1
13:       else
14:          currentIntensity ← currentIntensity + 1
15:          Set flag as False
16:       end if
17:    end while
18:    for any e ∈ G > currentIntensity + 1
19:       accumulator|e| ← accumulator|e| + 1
20:    end for
21: end while
22: Element-wise multiply accumulator with corresponding indices in unsorted intensity
23: Threshold accumulator using its mean value
24: Repeat Steps from 3 to 23 for |negative values| in 1
25: Join left and right accumulators preserving order

---

C. Identify Decision Boundaries

At step/operation 130, the boundaries of the clusters are identified, determined, located, and/or decided by detecting in the earlier step where the actual histogram of the image is extracted. There are two approaches to determine/decide the decision boundaries:

Distance-based: With the number of peaks calculated from the previous step, every pixel in the image is assigned the closest pixel value (according to Euclidean distance within the image) having an intensity of a detected peak.

Histogram-based: The intensity of minimum frequency between any two of the detected peaks is used as the decision boundary. The decision boundary point can be assigned to either peaks.

D. Example Study

Figure 5:
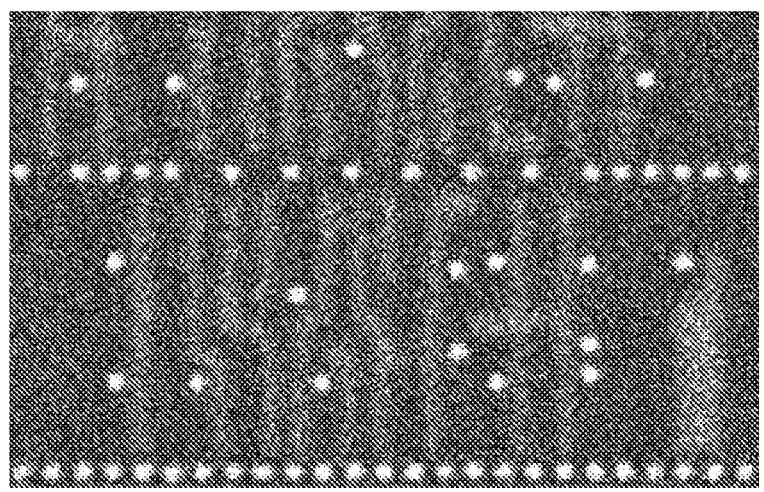
FIG. 5 illustrates a raw SEM image of an exemplary IC circuit.

A raw image involving a few single VIA's in FIG. 5 shows the smallest feature in the SEM and its size is found to be bounded between a kernel of size 4×4. Hence, the kernel size parameter is set to 3×3. The primary challenge lies in reducing noise such as those around the VIAs in FIG. 5. The grey stripes around the VIAs are polysilicon structures. The noise in the image causes the polysilicon regions to merge. In common applications of unsupervised segmentation, where the bounding regions do not have to be precise, this Algorithm 1 cannot be applied, because merging polysilicon regions during the segmentation process can affect the entire functionality of the final reverse engineered product. Hence, it is better to slightly over-segment the polysilicon regions than under-segment it to avoid incorrectly merged regions.

Figure 6A:
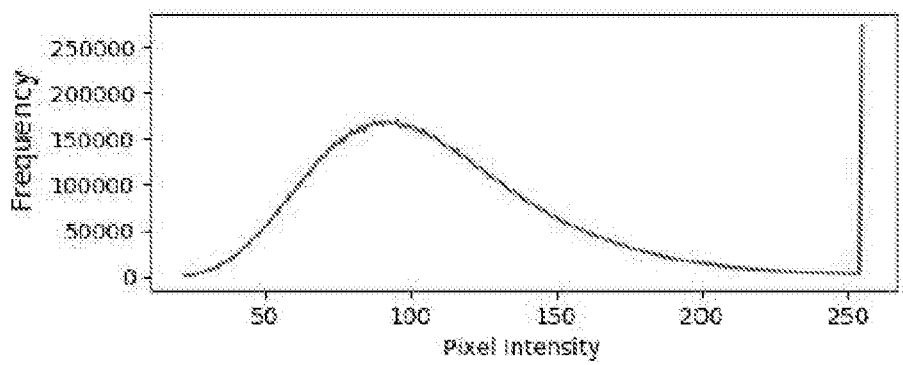
FIGS. 6(a) and 6(b) illustrate a histogram correction process, according to an embodiment of the subject invention.
Figure 6B:
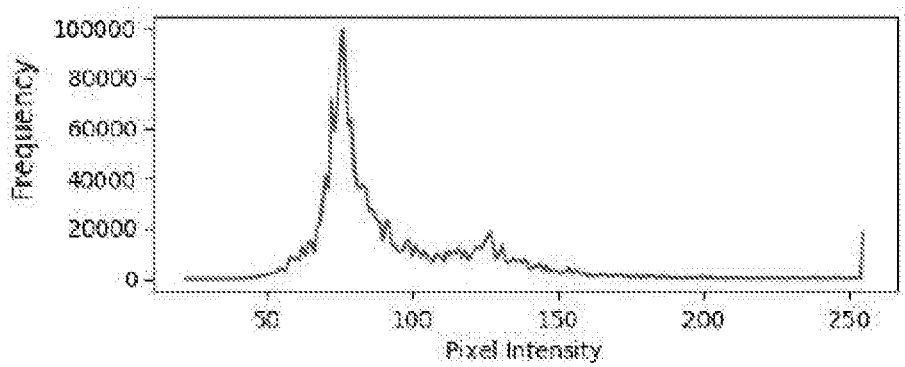

FIGS. 6(*a*) and 6(*b*) illustrate a histogram correction process to the raw image of the IC circuit in FIG. 5, according to an embodiment of the subject invention. FIG. 6(*a*) shows the raw image's histogram and FIG. 6(*b*) shows the extracted image histogram. It might be reasoned from the histogram in FIG. 6(*a*) that there are only two clusters of intensity, the peak around 100 pixel intensity and the off the scale peak just above 250 pixel intensity. However, it can be seen from FIG. 5 that there are roughly three clusters of intensity in the raw image: the grey strips of the polysilicon structures, the bright dots of VIAs and the dark silicon substrate. This prompts the need to pre-process the image histogram, e.g., described above with regard to the simple merge using convex optimization. The corrected histogram can be seen in FIG. 6(*b*). There are three clusters of image intensity present in the image as seen by three distinct peaks in the histogram chart.

Once the histogram is corrected, the next step is to calculate the decision boundaries between the clusters. This is, however, difficult due to the noise in the histogram.

Figure 7A:
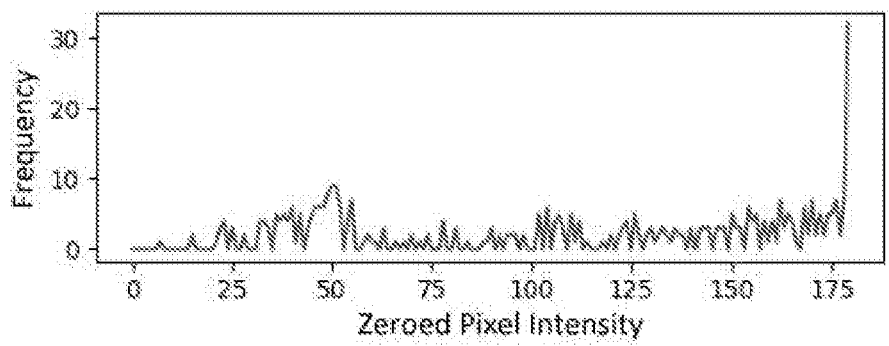
FIGS. 7(a) and 7(b) illustrate a histogram accumulation process, according to an embodiment of the subject invention.
Figure 7B:
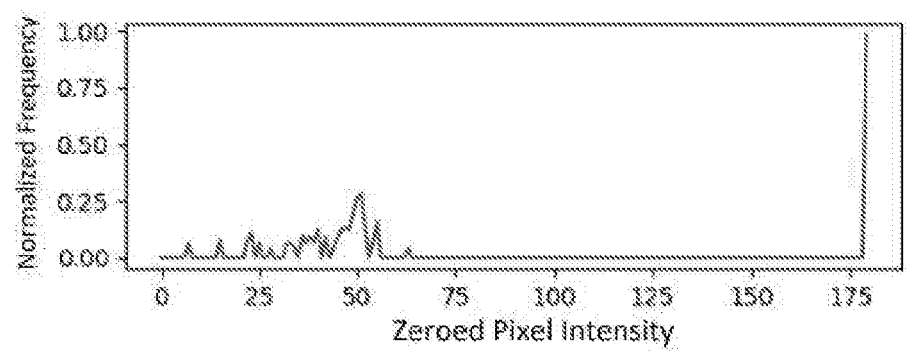

A simple smoothing can be effective, but it has the risk of smoothing out smaller peaks. Hence, Algorithm 1 has introduced the accumulator function to extract the peaks. The accumulator described in Algorithm 1 can be applied to FIG. 7(*a*). The basic idea behind the accumulator is that reasonably high frequency peaks that are farther away from the global maxima gets more weight by gaining extra "votes." This is a reasonable assumption; however, the number of the extra "votes" may be higher than the actual frequency peak itself. So, the accumulator is multiplied with the corresponding image histogram frequency values. This adjusts the accumulator so that only points with true high frequencies remain and the rest are filtered out. The result of this adjustment is shown in FIG. 7(*b*), where the unwanted noisy peaks are removed.

Figure 8:
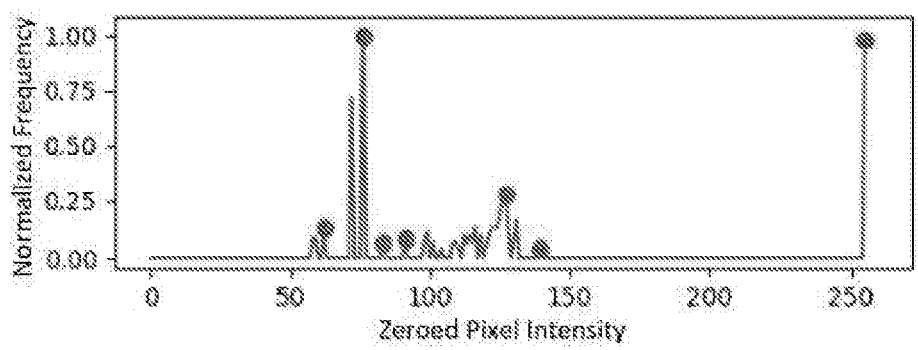
FIG. 8 illustrates a merged and thresholded accumulator showing cluster peaks, according to an embodiment of the subject invention.

The filtering process is enhanced further by thresholding the accumulator using the mean of the frequency values. Thresholding the accumulator yields the graph depicted in FIG. 8. The process results in distinct peaks with discontinuities between them. The peaks that are in contact are merged into one. The peaks that remain are highlighted using dots in the figure. Once the peaks are obtained, the histogram is divided between the peaks. The membership of each cluster can be decided, 1) using a simple distance metric to divide between two peaks, or 2) by using the lowest frequency point between the peaks in the histogram itself. The membership of each cluster is the peak it is assigned to, given a pixel intensity value. As can be seen in FIG. 8, the differences yielded by these two methods in the segmentation, from either the distance divide, or the lowest frequency point divide, are very small. Therefore, the better the representation of the image by the histogram is, the better the results will be using the latter method. On the other hand, if the histogram is not well presented, it would be better to use the distance-based metric to avoid over fitting the histogram.

The algorithm (Algorithm 1) can be applied in three common types of structures found in integrated circuits: a doped region, a polysilicon region, and a metal interconnect layer.

An exemplary experiment is performed on a 130 nm Smart Card IC chip. The source images were taken with the SEM imaging parameters: 100 µm for magnification, 10 µs/pixel for dwelling time, 1024×1024 for resolution, and 5 kV at excitation voltage respectively (or, for example, an excitation voltage range from 2 kV to 30 kV).

Figure 9A:
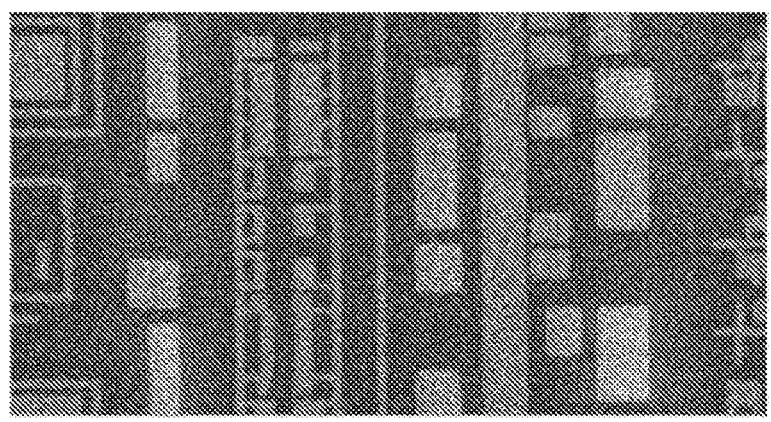
FIGS. 9(a) and 9(b) show a doped region in an SEM image of an exemplary IC circuit, transformed from the raw image shown in FIG. 9(a) to a segmented image shown in FIG. 9(b).
Figure 9B:
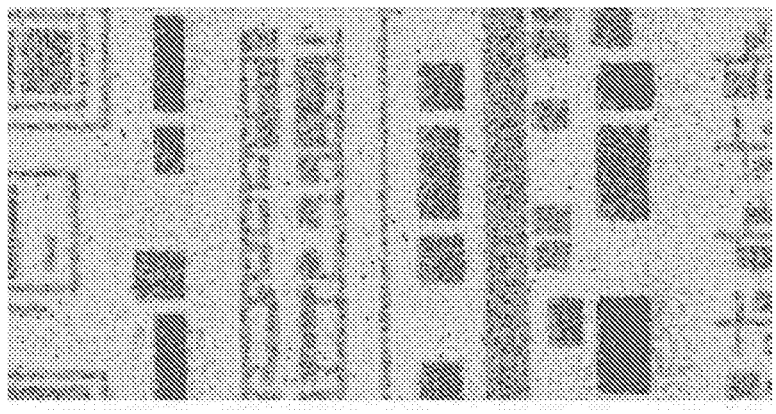

The results are shown in the following figures. The doped region image is depicted in FIG. 9(a). Doped regions are usually easier to segment from their larger sizes. However, due to the inherent noises in these images, as described earlier, these images can have more variations in their intensity. In this example, the variations are visible as bright regions on the lower left and lower right in the image. The auto-segmentation process/algorithm is forced to assign them to different clusters. But, the shapes of the structures are still conserved. The segmented image is shown in FIG. 9(b) which has similar large doped regions but with less noise.

Figure 10A:
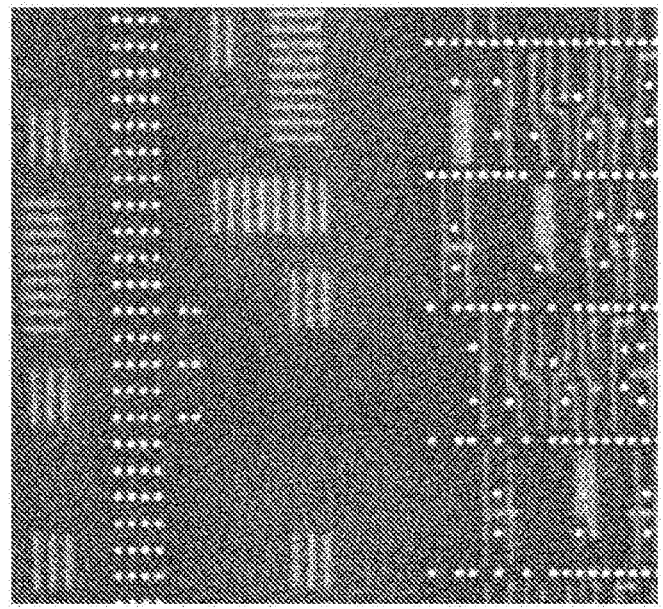
FIGS. 10(a) and 10(b) show a polysilicon region in an SEM image of an exemplary IC circuit, transformed from the raw image shown in FIG. 10(a) to a segmented image in FIG. 10(b).
Figure 10B:
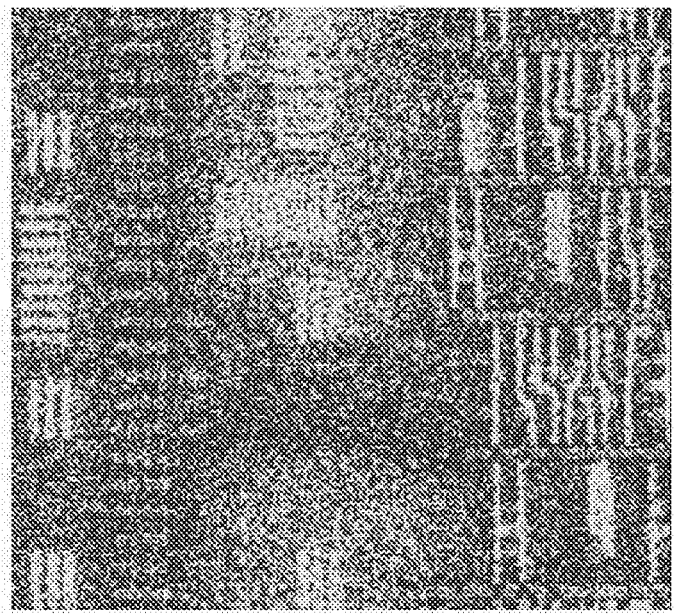

The SEM image of polysilicon region is shown in FIG. 10(a) and the post segmentation result is illustrated in FIG. 10(b). Polysilicon region is the hardest to segment because their small critical dimensions and high dense structures. The noise in this region is much higher than doped regions. Because of the criticality of polysilicon structures, any imperfection in the segmentation would cause a major setback in the reverse engineering procedure. The shapes of the structures determine its functionality in the completed circuit. Even though the segmentation result in FIG. 10(b) is still a bit noisy, it still extracts the shapes of the structures in addition to the VIAs. The noise occurs mostly on the silicon substrate area, which is inconsequential to the reverse engineering process, so can be ignored.

Figure 11A:
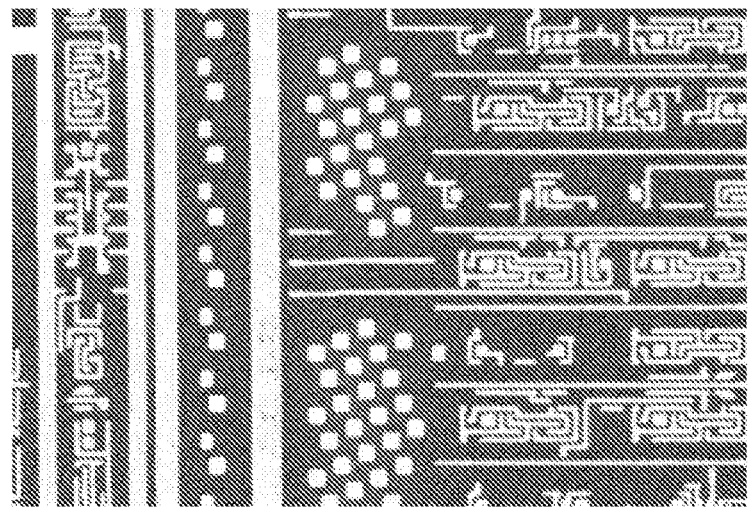
FIGS. 11(a) and 11(b) show a metal layer region in an SEM image of an exemplary IC circuit, transformed from the raw image shown in FIG. 11(a) to a segmented image in FIG. 11(b).
Figure 11B:
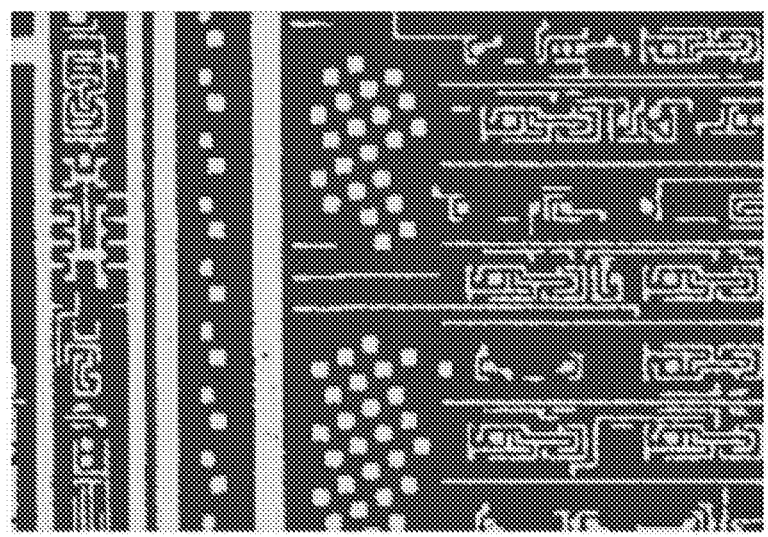

The SEM image of metal layer is shown in FIG. 11(a) and the post segmentation result is illustrated in FIG. 11(b). The conductive nature of the metal materials interacts with the electron beam during SEM imaging, effect of inherent noise on metal structure images is minimal in general. Hence, they are easy to segment. The result from the segmentation in FIG. 11(b) shows sharp and clean structures.

The technique strictly works on the histogram of images. The segmentation only relies on the working principles of the imaging modality to enhance contrast between different constituent materials. Hence, the sizes of the images do not affect the final results of segmentation. It does not try to model the noise sources or the IC features. So expensive data collection sessions can be avoided. In addition, since the IC features are not modeled, partial occlusions (matching) of the IC features from image stitching do not affect the segmentation process.

Unlike most off-the-shelf auto-segmentation processes/algorithms, the disclosed method does not depend on the type of underlying distribution of the pixels belonging to each of the materials. Hence, all visible peaks are extracted from histogram by the auto-segmentation process/algorithm even in presence of noise.

Further, the auto-segmentation process/algorithm does not require parameter fine-tuning. The only parameter used in the auto-segmentation process/algorithm is the size of the smallest feature that needs to be extracted. This can be easily calculated from the raw image or set to the minimum size possible without affecting the final result.

Finally, being unsupervised, the auto-segmentation process/algorithm can be made completely automated with no human interaction. The application of this algorithm to SEM images of IC reduces the time and labor required in imaging the IC die.

Currently imaging takes up most of the time in the reverse engineering process, the auto-segmentation process/algorithm would help in the complete reverse engineering of integrated circuits in a shorter time than previously possible, with IC chips made both in legacy and in higher node technologies.

E. Technical Advantages

This auto-segmentation process/algorithm has some unique advantages: it strictly works on the histogram of the image. Hence, the size of the image does not affect the final segmentation. It does not try to model the noise sources or the features. So expensive data collection sessions can be avoided. In addition, since the features are not modeled, partial occlusions (matching) of the features due to image stitching would not affect the segmentation process. The segmentation only relies on the working principles of the imaging modality to provide contrast between different constituent materials. The approach does not depend on the type of underlying distribution of the pixels belonging to each of the materials. The auto-segmentation process/algorithm also does not require parameter fine-tuning. The only parameter used in the auto-segmentation process/algorithm is the size of the smallest feature that needs to be extracted. This can be simply calculated from the raw image or set to the minimum size possible without affecting the final result.

CONCLUSION

The examples and embodiments described herein are for illustrative purposes only and that various modifications or changes in light thereof will be suggested to persons skilled in the art and are to be included within the spirit and purview of this application. In the attached claims, various elements are recited in different claims. However, the claimed elements, even if recited in separate claims, may be used together in any suitable combination.

The invention claimed is:

1. A method of segmenting a Scanning Electron Microscopy (SEM) image of an integrated circuit (IC), comprising:
    receiving a first SEM image of the IC, wherein (a) the first SEM image is acquired under a first set of SEM parameters, and (b) the IC comprises a plurality of structural elements;
    selecting a kernel size defined by a smallest feature to be extracted in the first SEM image;
    generating a filtered SEM image based at least in part on applying a filter with the selected kernel size to the first SEM image;
    generating a modified SEM image based at least in part on evaluating a cost function with a statistic of the filtered SEM image;
    extracting a first histogram of pixel intensity value frequencies from the modified SEM image;
    identifying one or more boundaries of the plurality of structural elements in the IC based at least in part on the first histogram; and
    auto-segmenting the first SEM image into at least a portion of the plurality of structural elements.

2. The method of segmenting a SEM image of an IC of claim 1, wherein the first SEM image is a raw SEM image.

3. The method of segmenting a SEM image of an IC of claim 1, wherein the first set of SEM parameters comprises a magnification, a resolution, and a dwelling time.

4. The method of segmenting a SEM image of an IC of claim 1, wherein the filter is a median filter of the kernel size, and wherein applying the filter comprises convolving the median filter with the first SEM image in a row raster fashion using a stride equal to a width of the kernel size.

5. The method of segmenting a SEM image of an IC of claim 1, wherein the segmented first SEM image depicts smaller elements of the IC for reverse engineering.

6. The method of segmenting a SEM image of an IC of claim 1, wherein the plurality of structural elements of the IC comprises doped regions, metal layers, and polysilicon regions.

7. The method of segmenting a SEM image of an IC of claim 1, wherein the SEM image is acquired with setting the SEM in an excitation voltage range from 2 kV to 30 kV.

8. The method of segmenting a SEM image of an IC of claim 1, wherein the method is automated.

9. An apparatus for segmenting a Scanning Electron Microscopy (SEM) image of an integrated circuit (IC), the apparatus comprising at least one processor and at least one memory including program code, the at least one memory and the program code configured to, with the processor, cause the apparatus to at least:
　　receive a first SEM image of the IC, wherein (a) the first SEM image is acquired under a first set of SEM parameters, and (b) the IC comprises a plurality of structural elements;
　　select a kernel size defined by a smallest feature to be extracted in the first SEM image;
　　generate a filtered SEM image based at least in part on applying a filter with the selected kernel size to the first SEM image;
　　generate a modified SEM image based at least in part on evaluating a cost function with a statistic of the filtered SEM image;
　　extract a first histogram of pixel intensity value frequencies from the modified SEM image;
　　identify one or more boundaries of the plurality of structural elements in the IC based at least in part on the first histogram; and
　　auto-segment the first SEM image into at least a portion of the plurality of structural elements.

10. The apparatus of claim 9, wherein the first SEM image is a raw SEM image.

11. The apparatus of claim 9, wherein the first set of SEM parameters comprises a magnification, a resolution, and a dwelling time.

12. The apparatus of claim 9, wherein the filter is a median filter of the kernel size, and wherein applying the filter comprises convolving the median filter with the first SEM image in a row raster fashion using a stride equal to a width of the kernel size.

13. The apparatus of claim 9, wherein the segmented first SEM image depicts smaller elements of the IC for reverse engineering.

14. The apparatus of claim 9, wherein the plurality of structural elements of the IC comprises doped regions, metal layers, and polysilicon regions.

15. The apparatus of claim 9, wherein the SEM image is acquired with setting the SEM in an excitation voltage range from 2 kV to 30 kV.

16. The apparatus of claim 9, wherein the segmenting the SEM image of the IC is automated.

17. A computer program product for segmenting a Scanning Electron Microscopy (SEM) image of an integrated circuit (IC), the computer program product comprising at least one non-transitory computer-readable storage medium having computer-readable program code portions stored therein, the computer-readable program code portions configured to:
　　receive a first SEM image of the IC, wherein (a) the first SEM image is acquired under a first set of SEM parameters, and (b) the IC comprises a plurality of structural elements;
　　select a kernel size defined by a smallest feature to be extracted in the first SEM image;
　　generate a filtered SEM image based at least in part on applying a filter with the selected kernel size to the first SEM image;
　　generate a modified SEM image based at least in part on evaluating a cost function with a statistic of the filtered SEM image;
　　extract a first histogram of pixel intensity value frequencies from the modified SEM image;
　　identify one or more boundaries of the plurality of structural elements in the IC based at least in part on the first histogram; and
　　auto-segment the first SEM image into at least a portion of the plurality of structural elements.

18. The computer program product of claim 17, wherein the segmented first SEM image depicts smaller elements of the IC for reverse engineering.

19. The computer program product of claim 17, wherein the plurality of structural elements of the IC comprises doped regions, metal layers, and polysilicon regions.

20. The computer program product of claim 17, wherein the SEM image is acquired with setting the SEM in an excitation voltage range from 2 kV to 30 kV.

* * * * *